US009520157B2

(12) United States Patent
Anderson

(10) Patent No.: US 9,520,157 B2
(45) Date of Patent: Dec. 13, 2016

(54) STORAGE MODES FOR MEASUREMENT VALUES AND CONTEXTUAL INFORMATION

(71) Applicant: Fluke Corporation, Everett, WA (US)

(72) Inventor: Thomas Duffy Anderson, Everett, WA (US)

(73) Assignee: Fluke Corporation, Everett, WA (US)

( * ) Notice: Subject to any disclaimer, the term of this patent is extended or adjusted under 35 U.S.C. 154(b) by 709 days.

(21) Appl. No.: 13/843,245

(22) Filed: Mar. 15, 2013

(65) Prior Publication Data
US 2014/0278255 A1    Sep. 18, 2014

(51) Int. Cl.
G11B 31/00 (2006.01)
G01D 7/04 (2006.01)
G01D 9/28 (2006.01)
G01M 99/00 (2011.01)
G01R 15/12 (2006.01)

(52) U.S. Cl.
CPC ............. G11B 31/00 (2013.01); G01D 7/04 (2013.01); G01D 9/285 (2013.01); G01M 99/00 (2013.01); G01R 15/125 (2013.01)

(58) Field of Classification Search
CPC .................................................. G11B 31/00
USPC ............................................... 702/189
See application file for complete search history.

(56) References Cited

U.S. PATENT DOCUMENTS

| 4,864,512 A | 9/1989 | Coulson et al. |
| 5,511,108 A | 4/1996 | Severt et al. |
| 7,191,184 B2 | 3/2007 | Laborde et al. |
| 7,703,032 B2 | 4/2010 | Wells |
| 8,358,903 B1 | 1/2013 | Meads et al. |
| 8,447,541 B2 | 5/2013 | Rada et al. |
| 8,456,152 B2 * | 6/2013 | Garland ............... G01R 15/125 324/115 |

(Continued)

FOREIGN PATENT DOCUMENTS

| EP | 2 026 079 B1 | 8/2011 |
| WO | 2004/044546 A1 | 5/2004 |

OTHER PUBLICATIONS

"287/289 True-rms Digital Multimeters," Users Manual (Rev. 2, Mar. 2009), Fluke Corporation, Everett, Wash., Jun. 2007, 88 pages.

(Continued)

Primary Examiner — Manuel L Barbee
Assistant Examiner — Raymond Nimox
(74) Attorney, Agent, or Firm — Seed IP Law Group LLP

(57) ABSTRACT

In one aspect, a portable handheld measurement device automatically stores measurement values in volatile memory in a limited replay storage mode that comprises a storage limitation that applies to the plurality of measurement values stored in the limited replay storage mode; receives a replay request; and, responsive to the replay request, presents at least some of the measurement values stored in the limited replay storage mode. In another aspect, a portable handheld measurement device automatically stores measurement values and associated contextual data according to a persistent storage mode; and automatically stores the measurement values according to a limited replay storage mode, wherein the limited replay storage mode comprises a storage limitation that is not present in the persistent storage mode.

20 Claims, 10 Drawing Sheets

(56) References Cited

U.S. PATENT DOCUMENTS

| | | | |
|---|---|---|---|
| 8,456,153 B2* | 6/2013 | Garland | G01R 15/125 |
| | | | 324/115 |
| 8,754,779 B2 | 6/2014 | Ruther | |
| 8,976,039 B2 | 3/2015 | O'Hara et al. | |
| 2003/0032448 A1* | 2/2003 | Bulthuis | G01S 5/0236 |
| | | | 455/556.1 |
| 2009/0045799 A1* | 2/2009 | Garland | G01R 15/002 |
| | | | 324/115 |
| 2009/0045800 A1* | 2/2009 | Garland | G01R 15/125 |
| | | | 324/115 |
| 2009/0128127 A1* | 5/2009 | Garland | G01R 19/2509 |
| | | | 324/115 |
| 2009/0128128 A1* | 5/2009 | Garland | G01R 15/125 |
| | | | 324/115 |
| 2010/0231197 A1 | 9/2010 | Jamieson et al. | |
| 2012/0130223 A1 | 5/2012 | Reicher | |
| 2013/0127904 A1 | 5/2013 | Dove et al. | |

OTHER PUBLICATIONS

Extech Instruments, "Extech EX540 Wireless Datalogging selected as 2010 EC&M Product of the Year Category Winner," Press Release, Mar. 18, 2009, 2 pages.

Extech Instruments, "Extech EX845 METERLiNK™ Clamp Meter Transmit Readings to FLIR IR Cameras," Press Release, Apr. 1, 2010, 3 pages.

Extech Instruments, "MultiMeter/Datalogger with Wireless PC Interface," Product Datasheet, Jul. 14, 2011, 1 page.

Extech Instruments, "Wireless TRMS Multimeter—Model EX540," User's Guide, Apr. 1, 2010, 17 pages.

Extended European Search Report, dated May 23, 2016, for European Application No. 14160239.1-1568 / 2778627, 9 pages.

* cited by examiner

STORAGE MODES FOR MEASUREMENT VALUES AND CONTEXTUAL INFORMATION

BACKGROUND

When troubleshooting or installing machines and systems, technicians typically use handheld devices useful for basic fault finding and field service work. These devices can generally be used to troubleshoot electrical, mechanical, or other problems in, or confirm proper installation of, a wide array of industrial and household devices, such as electronic equipment, motor controls, domestic appliances, power supplies, and wiring systems.

For proper diagnosis during troubleshooting, or when confirming proper installation of a device or system, technicians frequently make multiple measurements. Over the course of a day in the field, technicians may make measurements at different locations. Further, technicians are often involved in several projects at once, sometimes at multiple sites.

As the technician makes these measurements, the technician is required to separately record the measurements that are taken. Separate job sites or separate projects on the same site may require separate recording of measurements, which can be burdensome on the technician. Even when measurements are properly recorded using existing techniques (e.g., recording with pen and paper, a laptop computer, etc.), important contextual information may be missing or difficult to discern from the information that is recorded.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In one aspect, a portable handheld measurement device comprises a user input device; an output device; measurement circuitry configured to measure one or more parameters and generate a plurality of corresponding measurement values; a processor; and a storage system comprising volatile memory, the storage system having stored therein computer-executable instructions configured to cause the portable handheld measurement device to automatically store the plurality of measurement values in the volatile memory in a limited replay storage mode, wherein the limited replay storage mode comprises a storage limitation that applies to the plurality of measurement values stored in the limited replay storage mode; receive a replay request; and responsive to the replay request, present via the output device at least some of the plurality of measurement values stored in the limited replay storage mode.

In another aspect, a portable handheld measurement device comprises a user input device; an output device; measurement circuitry configured to measure one or more parameters and generate corresponding measurement values, wherein the measurement values are associated with contextual data; a processor; and a storage system having stored therein computer-executable instructions configured to cause the portable handheld measurement device to automatically store the measurement values and the associated contextual data in the storage system according to a persistent storage mode; and automatically store the measurement values in the storage system according to a limited replay storage mode, wherein the limited replay storage mode comprises a storage limitation that is not present in the persistent storage mode.

In another aspect, a portable handheld measurement device comprises an input/output interface comprising a display; measurement circuitry configured to measure one or more parameters and generate corresponding measurement values, wherein the measurement values are associated with contextual data; a processor; and a storage system comprising volatile memory and nonvolatile memory, the storage system having stored therein computer-executable instructions configured to cause the portable handheld measurement device to automatically store the measurement values and the associated contextual data in the nonvolatile memory according to a persistent storage mode; automatically store the measurement values in the volatile memory according to a limited replay storage mode, wherein the limited replay mode comprises a storage limitation that is not present in the persistent storage mode; display a user interface comprising at least some of the measurement values stored according to the limited replay storage mode; receive user input via the input/output interface; and display a modified version of the user interface based at least in part on the user input.

DESCRIPTION OF THE DRAWINGS

The foregoing aspects and many of the attendant advantages will become more readily appreciated as the same become better understood by reference to the following detailed description, when taken in conjunction with the accompanying drawings, wherein.

DETAILED DESCRIPTION

Figure 1:
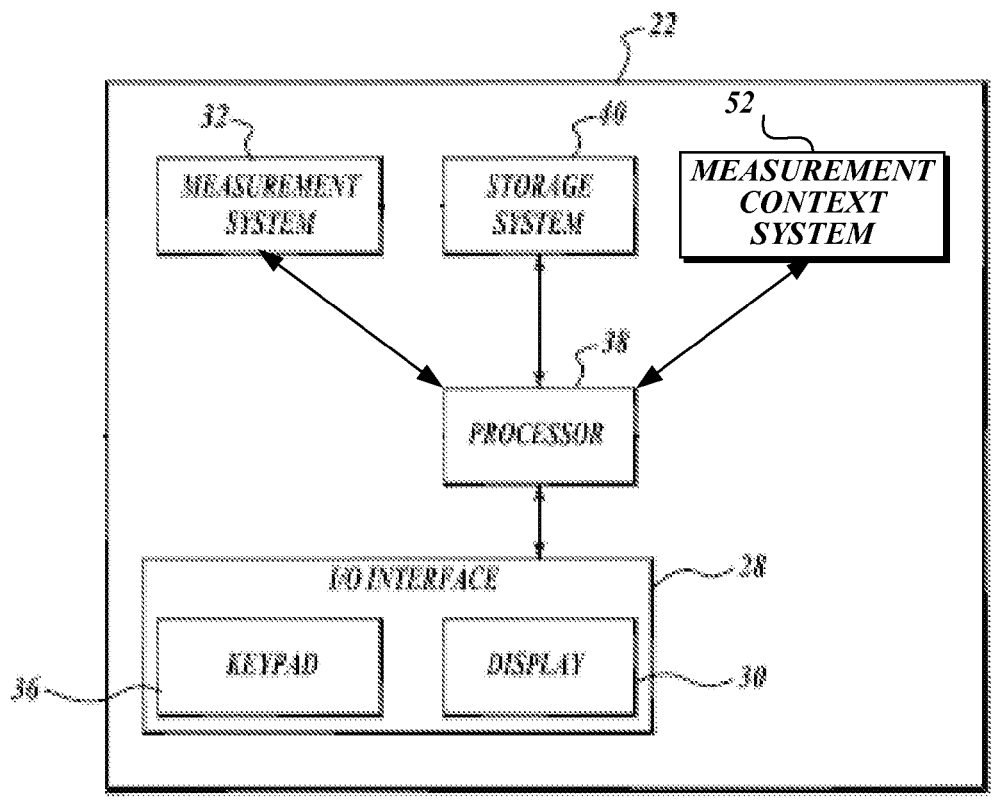
FIG. 1 is a schematic of a device in accordance with one or more embodiments of the present disclosure.

Embodiments of the present disclosure are generally directed to measurement devices that can collect measurement values and store them along with contextual information, as appropriate, in multiple storage modes. Described storage modes include a limited replay storage mode in which a limited number of previously measured values can be accessed without undue burden on a user. For example, if a technician is working on a piece of equipment and has not activated a logging mode, an auto hold feature, or a min/max/average feature, the technician can still access measurement values stored in a limited replay mode. In at least one embodiment, the limited replay storage mode is active whenever the device is on. Described storage modes also include a persistent storage mode that lacks the storage limitations of the limited replay mode and can be used to store larger amounts of measurement values along with contextual information (e.g., timestamp information, location information, environmental conditions, project or job site information, or other information), as appropriate. Depending on the amount of available storage and the amount of information to be stored, the persistent storage mode can be used to store measurement values and contextual information for the life of the measurement device. Information stored in the persistent storage mode can be mined to review previous measurements, assess device usage patterns, improve user experience, or for other purposes.

While some embodiments are illustrated and described, it will be appreciated that various changes can be made therein without departing from the spirit and scope of the disclosure. Each embodiment described in this disclosure is provided merely as an example or illustration and should not be construed as preferred or advantageous over other embodiments. The illustrative examples provided herein are not intended to be exhaustive or to limit the disclosure to the precise forms disclosed. Additionally, it will be appreciated that embodiments of the present disclosure may employ any combination of the features described herein.

Illustrative Devices, Systems, and Operating Environment

Prior to discussing the details of various aspects of the present disclosure, it should be understood that aspects of the following description may be presented in terms of logic and operations that may be performed by electronic components. These electronic components, which may be grouped in a single location or distributed over a wide area, generally include controllers, microcontrollers, control units, processors, microprocessors, etc. It will be appreciated by one skilled in the art that any logic described herein may be implemented in a variety of configurations, including but not limited to hardware, software, and combinations thereof. The hardware may include but is not limited to, analog circuitry, digital circuitry, processing units, application specific integrated circuits (ASICs), and the like, and combinations thereof. In circumstances in which the components of the system are distributed, the components are accessible to each other via communication links.

A handheld system or device as described herein is one or more devices generally configured to be holdable in a user's hand while taking a measurement. However, it should be appreciated that the system or device need not be held in a user's hand and may be positioned by a user to not be held, for example, affixed or hanging from a support or from a machine.

FIG. 1 depicts a handheld measurement device 22. The device 22 is generally configured to measure at least one electrical or mechanical parameter. In that regard, the device 22 may be configured to measure at least one electrical or mechanical parameter, including, but not limited to voltage, current, vibration, resistance, capacitance, inductance, frequency, and any calculated value derived from a primary electrical or mechanical measurement. The device 22 may be configured to measure other non-electrical, non-mechanical parameters, including, but not limited to, temperature, relative humidity, decibels, magnetic field, flow velocity, moisture, rotations per minute, pressure, distance, light, contact infrared, and a calculated value derived from a primary measurement, such as wattage, power quality, crest factor, and duty cycle.

The components of the device 22 will now be described in greater detail. The device 22 includes various components including an input/output (I/O) interface 28 (including, for example, a display 30 and keypad 36 for user input), a measurement system 32 for taking measurements, a measurement context system 52 for generating contextual information (e.g., timestamp information, location information, etc.) relating to measurements, a processor 38, and a storage system 40 for storing information.

In any of the examples described herein, a measurement context system (e.g., measurement context system 52) may comprise multiple subsystems, such as a time clock, GPS receiver unit, etc. The subsystems that are included within the measurement context system can vary depending on the contextual information to be generated and the functional design of particular devices. Although such subsystems are described as being part of a measurement context system for ease of discussion, such subsystems may be configured to serve other purposes in addition to providing contextual information for measurements.

In any of the examples described herein, information generated by a measurement system (e.g., measurement system 32) or a measurement context system (e.g., measurement context system 52) typically is processed by a processor (e.g., processor 38) to produce measurement values that are subsequently stored in the storage system 40. Alternatively, a measurement system can communicate directly with a storage system to store information generated by the measurement system.

The storage system 40 may include computer-readable storage media in the form of volatile memory (e.g., random access memory ("RAM")) and/or nonvolatile storage (e.g., nonvolatile memory such as read only memory ("ROM"), EEPROM, flash memory, or similar memory technology). The storage system also may include other kinds of nonvolatile storage, such as magnetic or optical disk storage. Those of ordinary skill in the art and others will recognize that memory typically stores data and/or program modules that are immediately accessible to and/or currently being operated on by the processor 38. In this regard, the processor 38 serves as a computational center of the device 22 by supporting the execution of instructions and processing of data that are stored in the storage system 40.

In general, functionality of devices described herein may be implemented in computing logic embodied in hardware or software instructions, which can be written in a programming language, such as C, C++, COBOL, JAVA™, PHP, Perl, HTML, CSS, JavaScript, VBScript, ASPX, Microsoft .NET™ languages such as C#, and/or the like. Computing logic may be compiled into executable programs or written in interpreted programming languages. Generally, functionality described herein can be implemented as logic modules that can be duplicated to provide greater processing capability, merged with other modules, or divided into submodules. The computing logic can be stored in any type of computer-readable medium (e.g., a non-transitory medium such as a storage medium) or computer storage device and be stored on and executed by one or more general-purpose or special-purpose processors.

The storage system 40 also stores information (e.g., measurement values) generated by the measurement system 32 of the device 22. For example, as described in further detail herein, the device 22 may store measurement values and/or contextual information in volatile memory in a limited replay storage mode and/or in nonvolatile storage (e.g., nonvolatile memory) in a persistent storage mode. When received in the storage system 40, the processor 38 may execute instructions configured to cause the device 22 to display the information received from the measurement system 32 or the storage system 40 on the display 30. For example, as described in further detail herein, the processor 38 may execute instructions configured to cause the device 22 to display measurement values and/or contextual information stored in volatile memory in a limited replay mode.

For user interaction with the device 22, the I/O interface 28 may include a variety of components that enable the processor 38 to obtain inputs from and provide outputs to a user and/or other components in the system 20. Although shown as including a keypad 36 and a display 30 in the illustrated embodiment, the I/O interface 28 may include, but is not limited to, a display, such as an LCD, an LPD, OLED display, etc., a keypad, hard or soft keyboards, a touchpad, physical buttons, a scroll wheel, a digital pen, a trackball, a joystick, etc. In one embodiment, the display 30 may be a touchscreen display that can also accept touch input.

Figure 2:
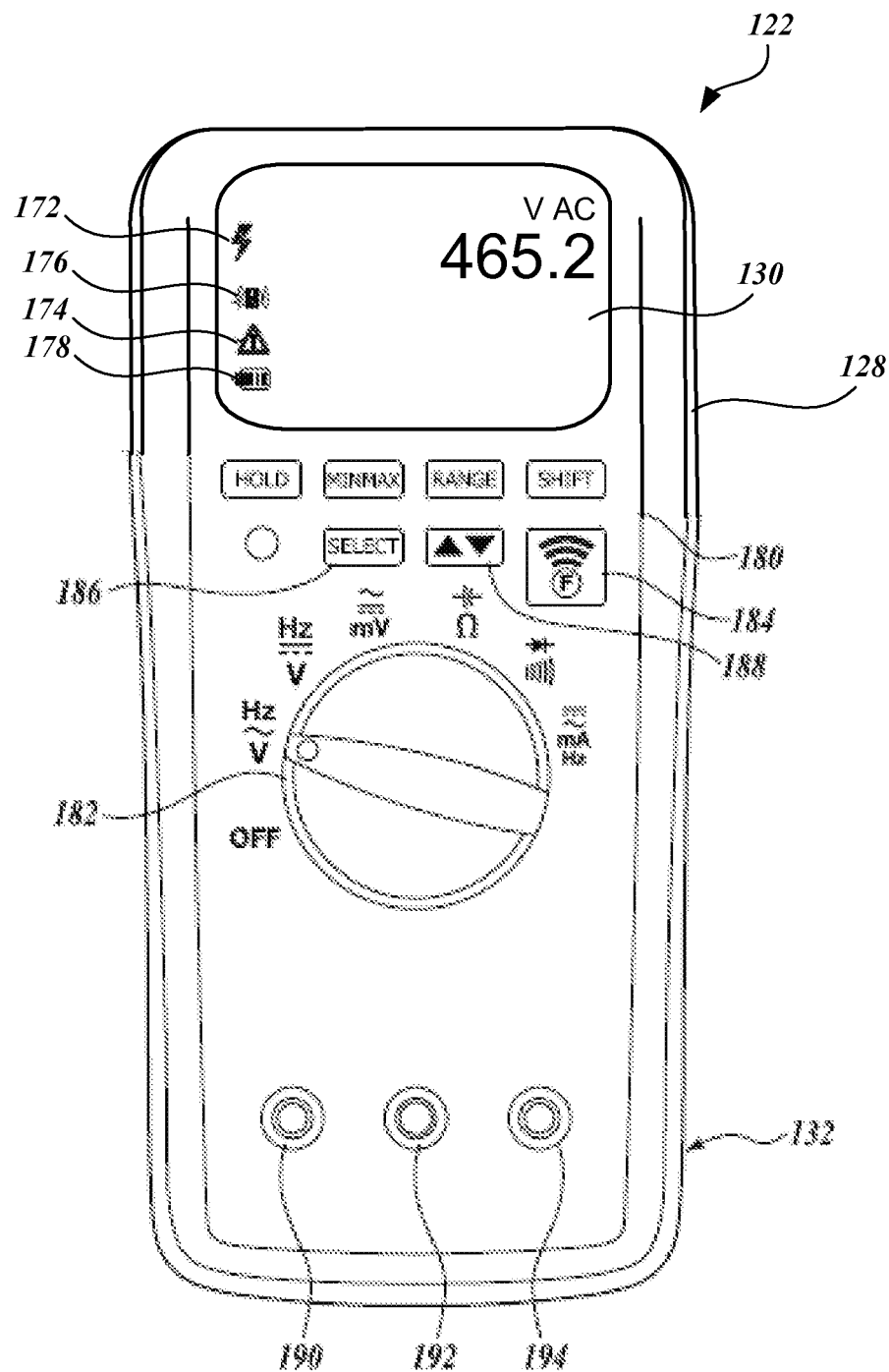
FIG. 2 is a front view of a device in accordance with one or more embodiments of the present disclosure.

Turning now to FIG. 2, an illustrative embodiment of a device 122 is provided. The I/O interface 128 of the device 122 includes a keypad 180 for inputting information, a rotary switch 182, and a measurement system 132. The keypad 180 includes various buttons for various different functions, including standard digital multimeter buttons, such as "HOLD", "MINMAX", "RANGE" and shift, and other function buttons including scroll button 188 and "select" button 186, which can be used to navigate a user interface by scrolling through items and making selections.

As discussed above, the rotary switch 182 includes exemplary DC voltage, AC voltage, resistance, continuity, and AC current, as indicated by the plurality of rotary switch positions in FIG. 2. However, it should be appreciated that the rotary switch 182 may include many other types of measurement parameters. In addition, the rotary switch 182 also includes an "off" position to stop measurements.

The measurement interface 132 for connecting measurement equipment includes various terminals to connect equipment to take measurements. In the illustrated embodiment, the terminals include a first terminal 190, which may be an input for current measurements and current frequency, a second terminal 192, which may be a return terminal for all instruments, and a third terminal 194, which may be an input for voltage, resistance, diode, capacitance, and voltage frequency.

In the example shown in FIG. 2, the display 130 is configured to display measurements from the device 122. For example, the display 130 includes a measurement value and a measurement type indication (reading, respectively, "465.2" and "V AC"). In FIG. 2, the measurement type indication corresponds to the measurement type selected on the rotary switch 182. Alternatively, the display 130 can be configured to include measurement values and measurement types that correspond to measurements from any number of secondary devices. For example, communication button 184 can be pressed to set the device 122 to turn on communication circuitry and communicate with one or more secondary devices to obtain and display measurement values.

The display 130 may also be configured to display other information, for example, hazardous voltage being measured 172, risk of danger 174, data transmission status 176, and battery status 178 of the device 122. The display 130 may also be configured to include other information not shown in FIG. 2, such as location information (e.g., a location of the device 122 as detected by a GPS unit), data storage mode information, etc.

Figure 3:
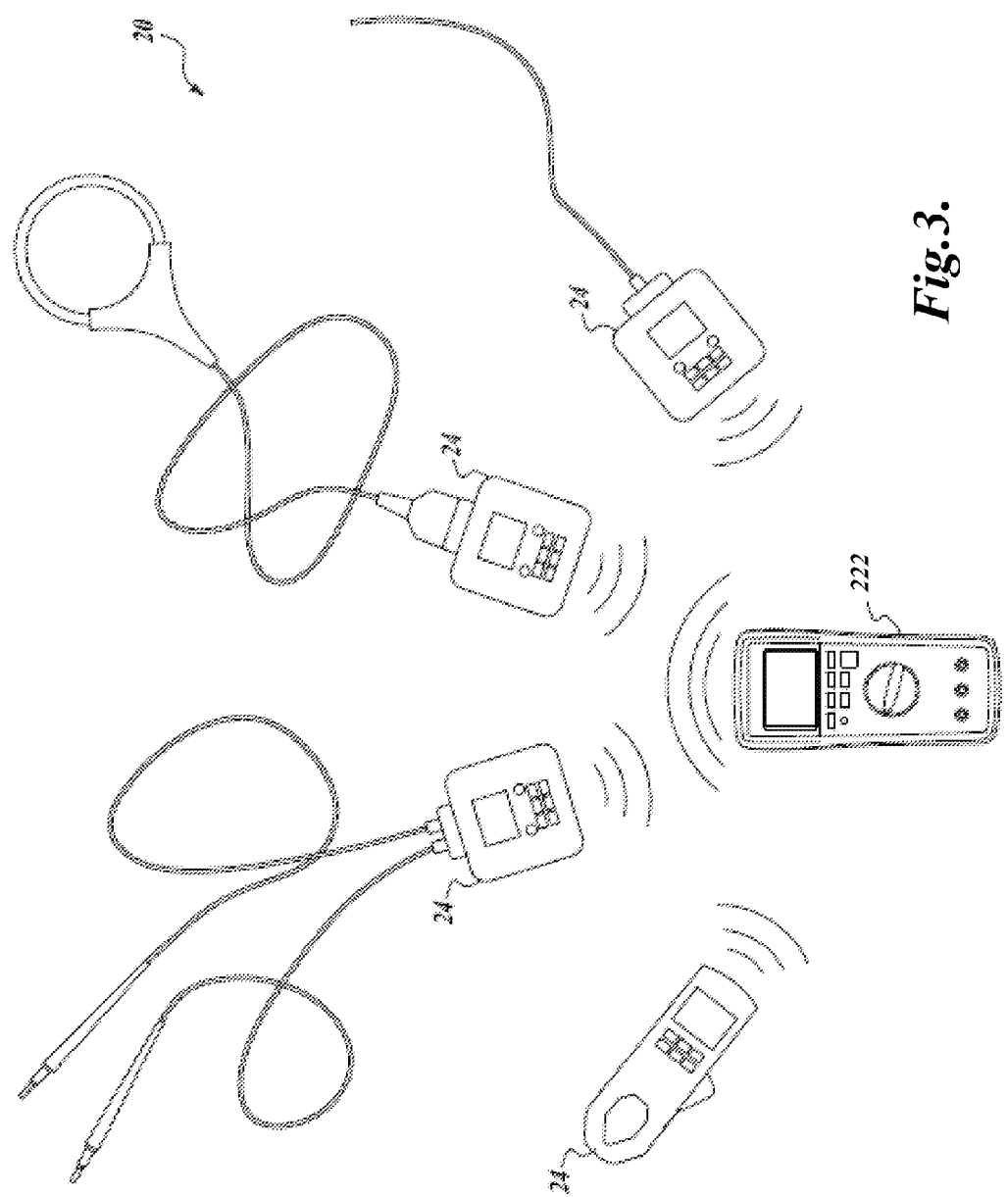
FIG. 3 is a schematic of operation of a system comprising a primary device and a secondary device in accordance with one or more embodiments of the present disclosure.
Figure 4:
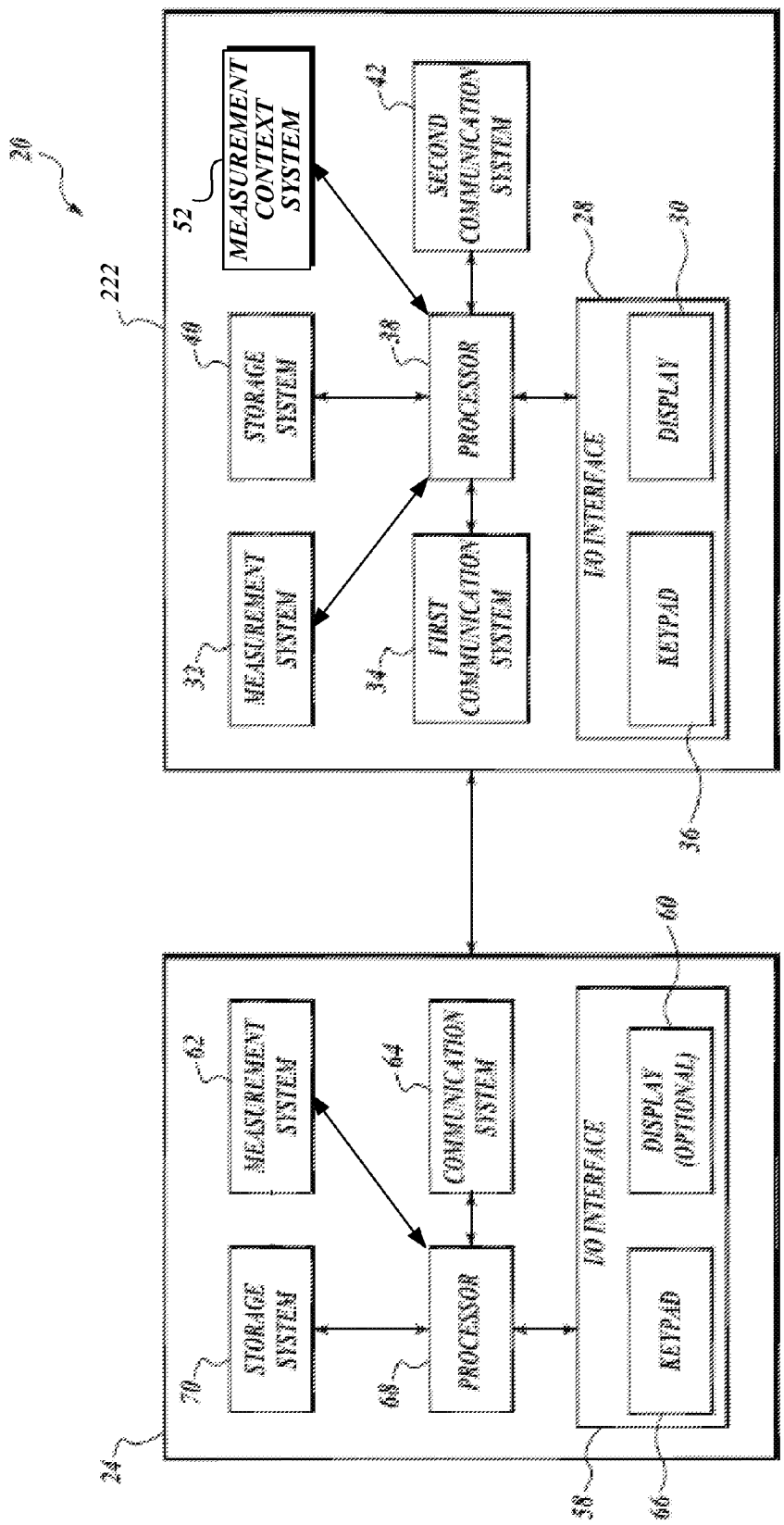
FIG. 4 is a schematic of a system comprising a primary device and a secondary device in accordance with one or more embodiments of the present disclosure.

As can be seen in FIGS. 3 and 4, one embodiment of the present disclosure is directed to a system 20 that includes a plurality of handheld or portable measurement devices. For example, the system 20 includes a primary device 222 and one or more secondary devices 24. In one embodiment of the present disclosure, the primary device 222 is capable of taking a first measurement, and the secondary device 24 is capable of taking a second measurement and transmitting the second measurement to the primary device 222.

The primary device 222 may further include a display 30 for displaying data, whether the data is collected from other devices in the system 20 or the primary device 222. In one embodiment of the present disclosure, the primary device 222 is a multimeter, such as a digital multimeter. In that regard, the primary device 222 may be an electronic measuring instrument that combines one or more measurement functions in one unit. As a non-limiting example, the primary device 222 may be capable of taking multiple measures, such as DC voltage, AC voltage, resistance, continuity, and AC current.

The secondary device 24 may be the same or different from the primary device 222. For example, the secondary device 24 may be a digital multimeter or, as shown in FIG. 3, the secondary device 24 may be a temperature module, a clamp meter, or a flexible current probe meter.

The primary device 222 may be a host device and the secondary devices 24 may be "slave" devices in some embodiments. In that regard, the primary device 222 may be configured for collecting data received from various secondary devices 24 in the system 20.

Referring to the schematic of FIG. 4, the components of the primary device 222 will now be described in greater detail. The primary device 222 includes various components including an input/output (I/O) interface 28 (including, for example, a display 30 and an input interface 36 for user input), a measurement system 32 for taking measurements, a measurement context system 52, a first communication system 34 for receiving and/or transmitting information, a processor 38, and a storage system 40. The primary device 222 may further include an optional second communication system 42.

In the example shown in FIG. 4, the storage system 40 stores information (e.g., measurement values) generated by the measurement system 32 of the primary device 222 and from measurement systems in secondary devices 24 received through the communication system 34. For example, as described in further detail herein, the primary device 222 may store measurement values and/or contextual information in a limited replay storage mode and/or a persistent storage mode. When received in the storage system 40, the processor 38 may be configured to execute instructions to directly display the information received from the measurement system 32, the first communication system 34, or the storage system 40 on the display 30. For example, as described in further detail herein, the processor 38 may execute instructions configured to cause the primary device 222 to display measurement values and/or contextual information stored in volatile memory in a limited replay storage mode.

The first communication system 34 includes one or more components for communicating directly with one or more secondary devices 24 using a suitable wired or wireless communication protocol for transmitting and/or receiving information, including but not limited to USB, Ethernet, WiFi, Bluetooth, or any other suitable wired or wireless communication protocols. Further, the primary device 222 may include additional communication circuitry, such as a second communication system 42, for communicating with a separate computing device (e.g., a server, a desktop computing device, or a mobile computing device such as a tablet computer, smartphone, laptop computer, or the like). Alternatively, the first and second communication systems 34, 42 may be combined in a single communication system.

Measurement made by secondary devices 24 may be electrical, mechanical, physical, or other parameters, including, but not limited to, voltage, current, vibration, resistance, capacitance, inductance, frequency, temperature, relative humidity, magnetic field, flow velocity, moisture, rotations per minute, pressure, distance, light, contact infrared, decibels, and a calculated value derived from a primary measurement, such as wattage, power quality, crest factor, and duty cycle.

Returning to the illustrated embodiment of FIG. 4, the components of a secondary device 24 will now be described in greater detail. The secondary device 24 includes various components including an input/output (I/O) interface 58 (including, for example, an optional display 60 and an input interface 66 for user input), a measurement system 62 for taking measurements, a communication system 64 for receiving and/or transmitting information, a processor 68, and a storage system 70 for storing information. The secondary device 24 may be controlled by the primary device 222 or may be independently controlled.

Detailed Examples

In accordance with described embodiments, a single device (e.g., device 22, device 122) or a system comprising multiple devices (e.g., a system comprising a primary device 222 and one or more secondary devices 24) implements one or more storage modes to facilitate short-term or longer-term storage of measurement values, contextual data, or other information, while avoiding unnecessary burdens on the operator of the respective system or device.

Figure 5:
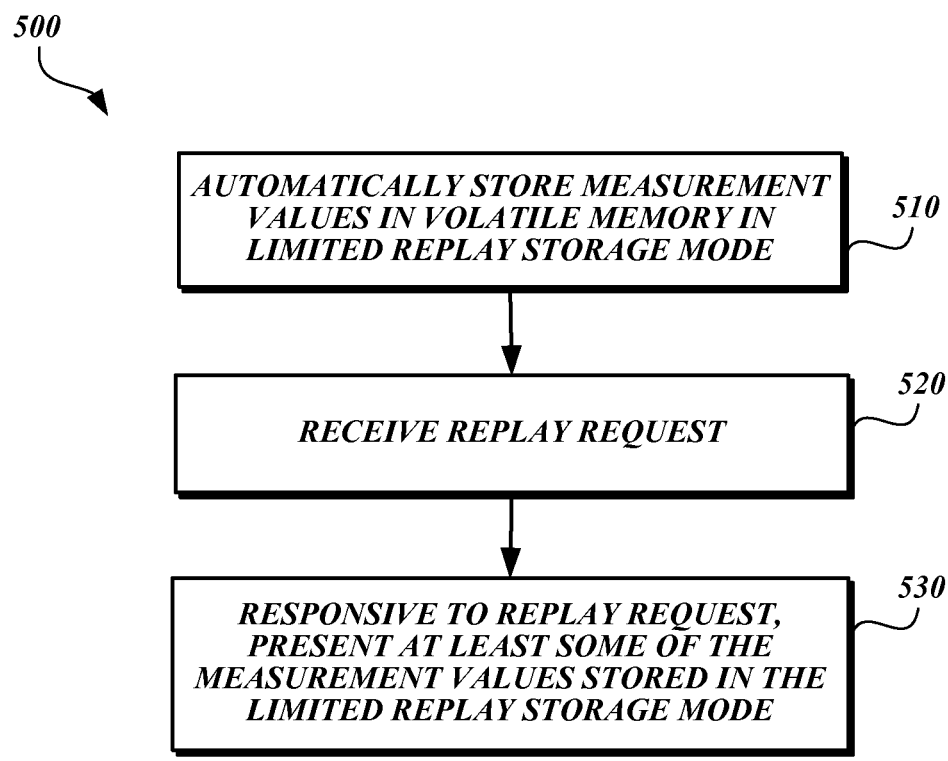
FIG. 5 is a flowchart diagram depicting a limited replay storage mode in accordance with one or more embodiments of the present disclosure.
Figure 6:
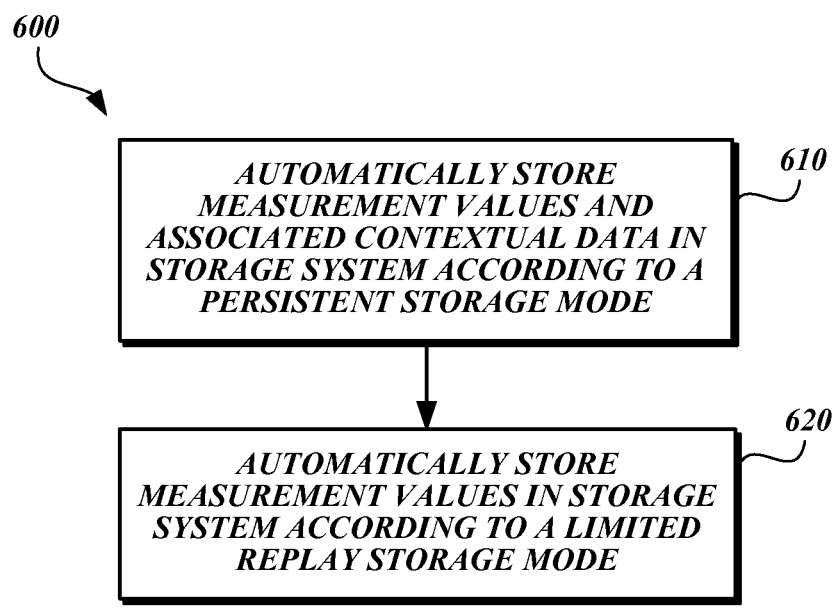
FIGS. 6 and 7 are flowchart diagrams depicting a limited replay storage mode and a persistent storage mode in accordance with one or more embodiments of the present disclosure.
Figure 7:
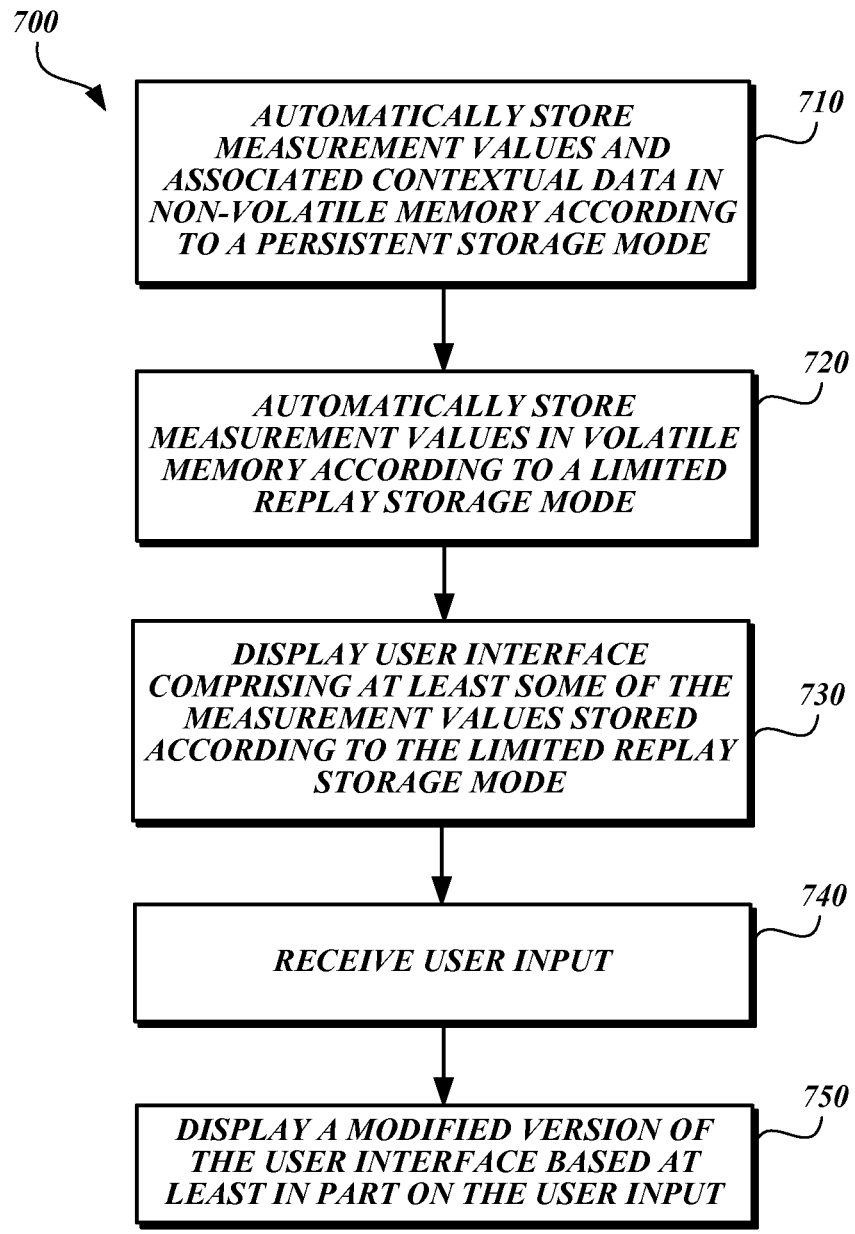

FIGS. 5-7 are flow charts showing illustrative techniques 500, 600, and 700, respectively, for storing measurement values and other information in described storage modes. The illustrative techniques 500, 600, and 700 can be performed by a single device (e.g., device 22, device 122, device 322) or a system comprising multiple devices (e.g., a system comprising a primary device 222 and one or more secondary devices 24), as described herein.

In the illustrative technique 500 shown in FIG. 5, at step 510 a device (e.g., a digital multimeter) automatically stores measurement values (and potentially other information, such as contextual information that corresponds to the measurement values) in volatile memory in a limited replay storage mode. The limited replay storage mode comprises a storage limitation (e.g., a time limitation or a memory size limitation) that applies to information stored in the limited replay storage mode. In one embodiment, the limited replay storage mode specifies storing the measurement values in a circular data buffer. In this way, the limited replay storage mode can permit overwriting of previously stored measurement values in order to accommodate the storage limitation and provide access to more recent measurement values (e.g., in a rolling time window). Alternatively, other data structures can be used to store measurement values in the limited replay storage mode. At step 520, the device receives a replay request. For example, the device may receive user input corresponding to a replay request from an input/output interface of the device (e.g., from a hardware button, a soft button presented as part of a user interface on a touchscreen, or the like). At step 530, responsive to the replay request, the device presents at least some of the measurement values stored in the limited replay storage mode. For example, in one embodiment, the device presents a replay of at least some of the measurement values via an output device (e.g., a display) in response to input received via the user input device. The replay may comprise, for example, display of at least some of the measurement values in list form, in graph form, or in some other form. The replay may be presented according to configurable parameters. For example, the replay may include measurement values obtained during a specified time period.

Multiple storage modes can be used. For example, in the illustrative technique 600 shown in FIG. 6, at step 610 a device (e.g., a digital multimeter) automatically stores (e.g., in nonvolatile storage, such as nonvolatile memory) measurement values and contextual information that corresponds to the measurement values according to a persistent storage mode. As examples, the contextual data may include one or more of timestamp information, location information (e.g., GPS coordinates corresponding to the location where the measurement value was obtained), project or job site information, and environmental conditions that may be detected via corresponding sensors (e.g., lighting conditions, relative humidity, air temperature). Other information (e.g., user input events such as button presses associated with the device) also can be stored in the persistent storage mode. At step 620, the device automatically stores (e.g., in a block of volatile memory) measurement values in a limited replay storage mode. The same measurement values can be stored in both storage modes to allow for different types of analysis (e.g., short-term replay-style analysis that may be useful to an operator of the device shortly after the measurement values are obtained, and longer-term data mining that may be performed by the operator or by some other entity).

Storage of information in the persistent storage mode and/or the limited replay storage mode can be adapted or modified based on user-configurable settings. For example, an opt-out provision may be provided for users that do not wish (e.g., due to privacy concerns) to store contextual information (e.g., GPS coordinates) in persistent storage. As another example, a user may be given the option to turn the persistent storage mode and/or the limited replay storage mode on or off, or to switch between modes. Storage modes and/or selection of storage modes also can depend on device status (e.g., available memory or storage capacity). For example, if nonvolatile storage capacity is below a threshold, the device can automatically turn off the persistent storage mode in order to conserve storage capacity. As another example, if system memory capacity is below a threshold, the device can automatically turn off the limited replay storage mode in order to conserve system memory.

As another example, in the illustrative technique 700 shown in FIG. 7, at step 710 a device (e.g., a digital multimeter) automatically stores measurement values and contextual information that corresponds to the measurement values in nonvolatile memory according to a persistent storage mode. At step 720, the device automatically stores measurement values in volatile memory in a limited replay storage mode. At step 730, the device displays a user interface comprising at least some of the measurement values stored according to the limited replay storage mode. At step 740, the device receives user input. At step 750, the device displays a modified version of the user interface based at least in part on the user input. For example, a user may press the scroll button 188 depicted in FIG. 2 to scroll through measurement values and/or press the select button 186 depicted in FIG. 2 to select a measurement to display in more detail.

Figure 8A:
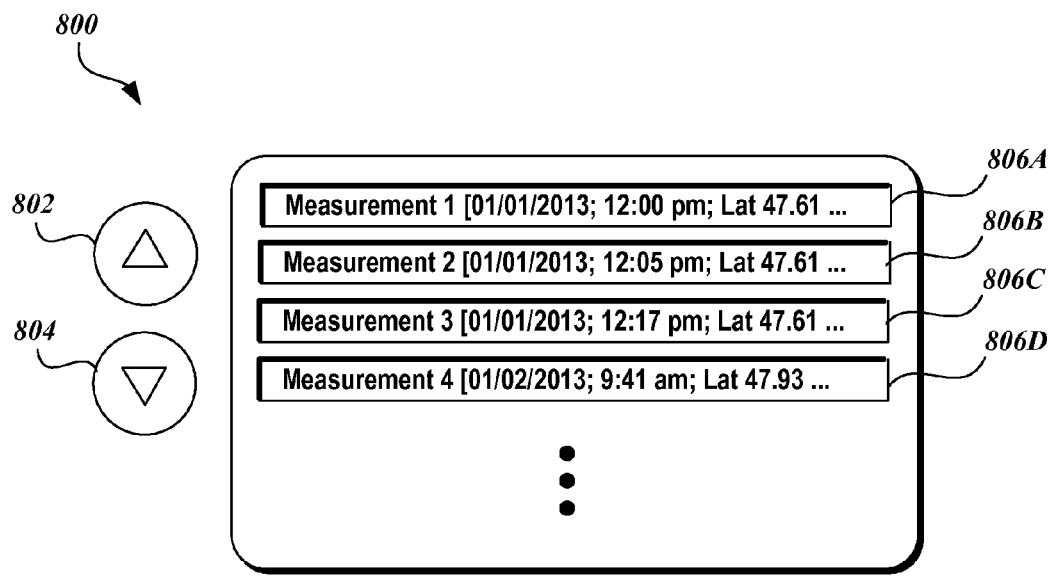
FIGS. 8A and 8B are schematics of user interfaces in accordance with one or more embodiments of the present disclosure.
Figure 8B:
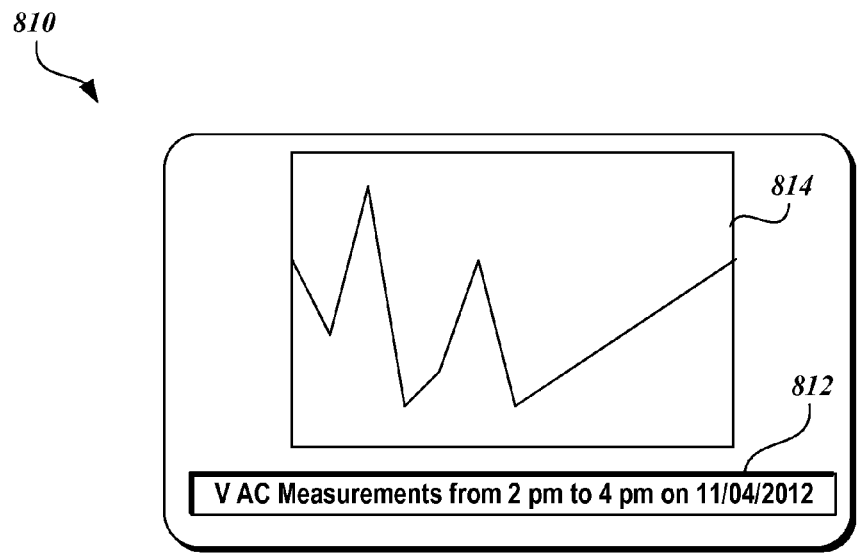

FIGS. 8A and 8B depict illustrative user interfaces 800, 810 that can be used in accordance with any of the techniques, devices, or storage modes described herein. For example, the user interfaces 800, 810 can be presented on a display of a measurement device to show measurement values stored in a limited replay storage mode. As another example, the user interfaces 800, 810 can be presented on a display of a post-processing device, as described in further detail below.

In the example shown in FIG. 8A, the user interface 800 includes scroll buttons 802, 804, and a list of measurement values. The measurement values are depicted as appearing inside text elements 806A-806D. In this example, the text elements 806A-806D also include contextual information, such as timestamp information (e.g., date and time) and location information (e.g., "Lat 47.61"). As shown, the measurement values were obtained over two days at different locations. Alternatively, the measurement values can be displayed according to different parameters, such as a shorter time period.

In the example shown in FIG. 8B, the user interface 810 includes a graph 814 that shows measurement values in graphical form. As shown, the measurement values depicted in the graph 814 were obtained over a two-hour period on a single day. The time parameters for the measurement values is reflected in the text element 812. Alternatively, the measurement values can be displayed according to different parameters, such as a longer time period, a particular location (e.g., as defined by GPS coordinates), a particular project or job site, etc. The parameters can be determined based on user input or pre-configured settings. Alternatively, the parameters shown in text element 812 can be displayed automatically based on the measurement values and/or corresponding contextual information. For example, in a limited replay storage mode, the parameters may be based on contextual information associated with measurement values. As shown in text element 812, the parameters may be automatically generated based on time information in timestamps associated with the most recent and least recent measurements (e.g., the most recent and least recent elements in a circular buffer that stores data records containing measurement values) obtained in the limited replay storage mode.

Figure 9:
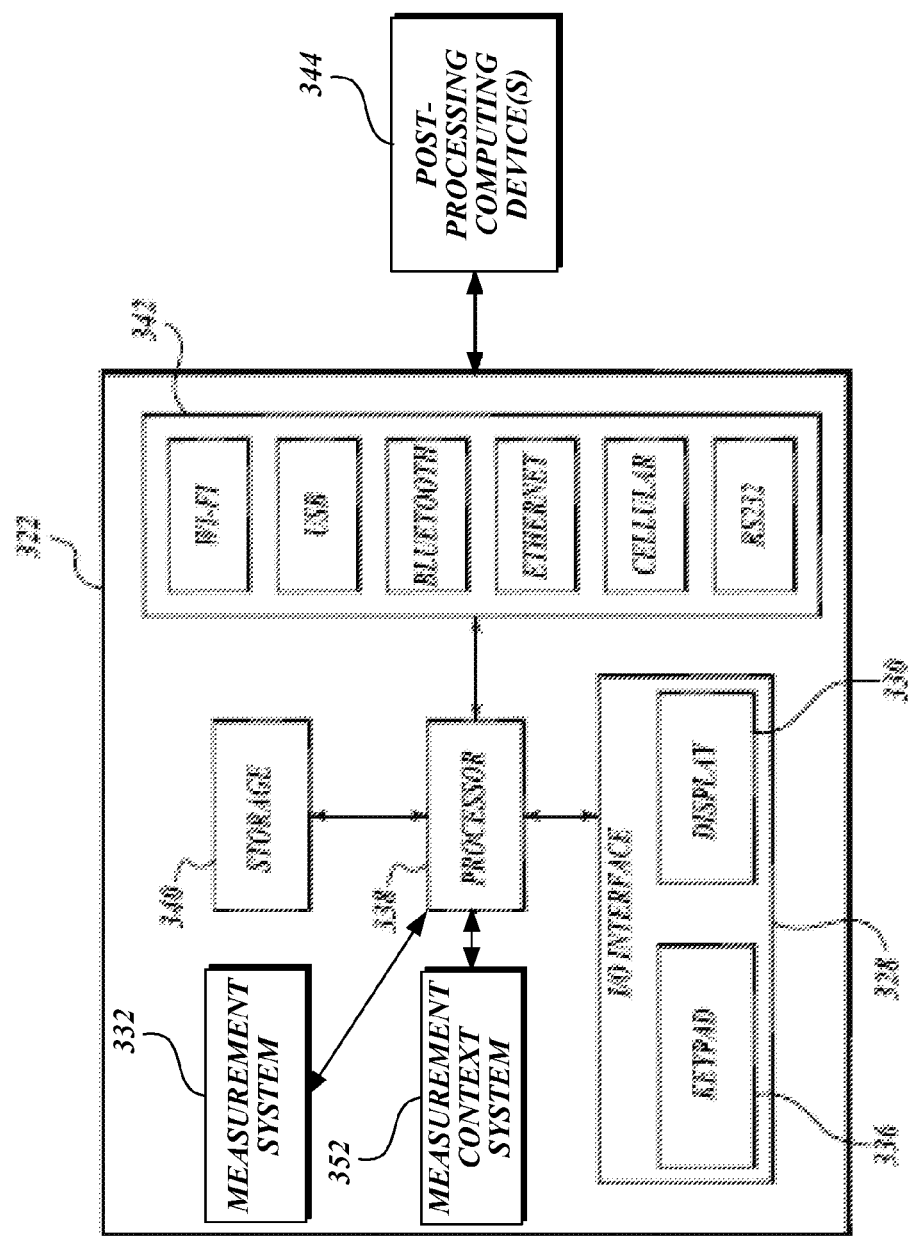
FIGS. 9-11 are schematics of a device in communication with one or more post-processing computing devices in accordance with one or more embodiments of the present disclosure.

Referring to FIG. 9, an illustrative system including a device 322 and post-processing computing device 344 is illustrated. Data that is stored in the device 322 can be communicated via a communication system of the device to the post-processing computing device 344 for further processing. For example, information stored in a persistent storage mode can be mined to review previous measurements, assess device usage patterns, improve user experience, or for other purposes. Depending on the amount of available storage and the amount of information to be stored, the persistent storage mode can be used to store measurement values and contextual information over an extended period of time, up to the extent of the operative life of the device. As another example, information stored in a limited replay storage mode can be monitored at a remote location by the post-processing device 344 (e.g., for quality control purposes). The device 322 includes an input/output (I/O) interface 328 (including, for example, a display 330 and a keypad 336), a measurement system 332, a measurement context system 352, a processor 338, a storage system 340, and a communication system 342 for receiving and/or transmitting (e.g., via a direct connection, a local network, or a wide-area network such as the Internet) information to the post-processing device 344 (e.g., via the Internet or a local network).

Figure 10:
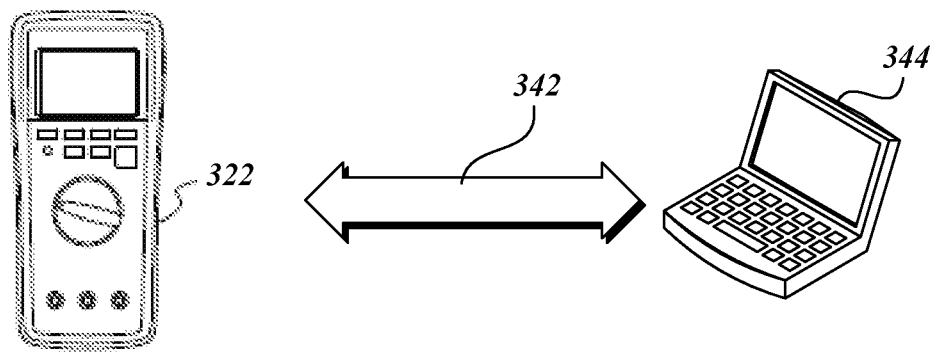
Figure 11:
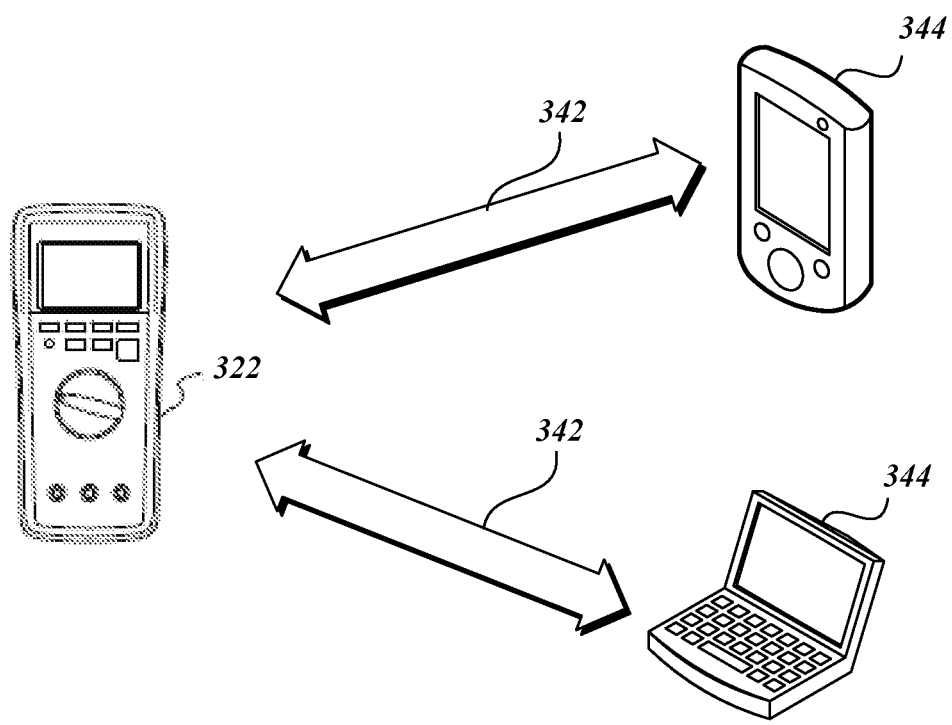

Referring to FIGS. 10 and 11, a measurement device such as the device 322 can communicate with one or more post-processing devices 344. Typically, the post-processing devices 344 run software that can be used for viewing, analyzing, and/or manipulating data received from the device 322. For example, as shown in FIG. 10, the device 322 communicates with a laptop computer via the communication system 342 of the device 322. As shown in FIG. 11, the device 322 communicates with a laptop computer and a tablet computer or smartphone via the communication system 342 of the device 322. The post-processing devices 344 and the device 322 can be controlled by one entity or by different entities.

The device 322 also may include a second communication system for communicating with one or more secondary device (e.g., secondary device 24, as shown in FIGS. 3 and 4). The device 322 can communicate data received from one or more secondary devices to any post-processing computing device 344.

Extensions and Alternatives

Many alternatives to the systems and devices described herein are possible. Although some examples in the present disclosure include descriptions of devices comprising specific hardware components in specific arrangements, techniques and tools described herein can be modified to accommodate different hardware components, combinations, or arrangements. Further, although some examples in the present disclosure include descriptions of specific usage scenarios, techniques and tools described herein can be modified to accommodate different usage scenarios.

Many alternatives to the user interfaces described herein are possible. In practice, the user interfaces described herein may be implemented as separate user interfaces or as different states of the same user interface, and the different states can be presented in response to different events, e.g., user input events. The elements shown in the user interfaces can be modified, supplemented, or replaced with other elements in various possible implementations.

Many alternatives to the techniques described herein are possible. For example, processing stages in the various techniques can be separated into additional stages or combined into fewer stages. As another example, processing stages in the various techniques can be omitted or supplemented with other techniques or processing stages. As another example, processing stages that are described as occurring in a particular order can instead occur in a different order. As another example, processing stages that are described as being performed in a series of steps may instead be handled in a parallel fashion, with multiple modules or software processes concurrently handling one or more of the illustrated processing stages. As another example, processing stages that are indicated as being performed by a particular device or module may instead be performed by one or more other devices or modules.

While illustrative embodiments have been illustrated and described, it will be appreciated that various changes can be made therein without departing from the spirit and scope of the invention.

The embodiments of the invention in which an exclusive property or privilege is claimed are defined as follows:

1. A portable handheld measurement device, comprising:
a user input component;
an output component;

measurement circuitry configured to measure one or more electrical or mechanical parameters and generate a plurality of corresponding measurement values;
a processor; and
a storage system comprising volatile memory and nonvolatile memory, the storage system having stored therein computer-executable instructions configured to cause the portable handheld measurement device to:
automatically and concurrently store the same plurality of measurement values in the volatile memory in a limited replay storage mode and in the nonvolatile memory in a persistent storage mode, wherein the limited replay storage mode comprises a storage limitation that applies to the plurality of measurement values stored in the limited replay storage mode and the persistent storage mode lacks the storage limitation of the limited replay storage mode, and wherein the limited replay storage mode permits overwriting measurement values previously stored in the volatile memory to accommodate the storage limitation and to provide access to more recent measurement values, the plurality of measurement values being stored in the volatile memory using a rolling time window in which least recent measurement values in the volatile memory are automatically overwritten by most recent measurement values;
receive a replay request; and
responsive to the replay request, present via the output device at least some of the plurality of measurement values stored in the volatile memory in the limited replay storage mode.

2. The portable handheld measurement device of claim 1, wherein the storage limitation of the limited replay storage mode comprises a time limitation.

3. The portable handheld measurement device of claim 1, wherein the storage limitation of the limited replay storage mode comprises a memory size limitation.

4. The portable handheld measurement device of claim 1, wherein the limited replay storage mode specifies storing the measurement values in a circular data buffer.

5. The portable handheld measurement device of claim 1, wherein the computer-executable instructions are further configured to cause the portable handheld measurement device to present a replay of at least some of the measurement values via the output device in response to input received via the user input device.

6. The portable handheld measurement device of claim 5, wherein the output device comprises a display and wherein the replay comprises display of at least some of the measurement values in list form.

7. The portable handheld measurement device of claim 5, wherein the output device comprises a display and wherein the replay comprises display of at least some of the measurement values in graph form.

8. The portable handheld measurement device of claim 5, wherein the output device comprises a display and wherein the replay comprises display of replay parameters along with at least some of the measurement values.

9. The portable handheld measurement device of claim 8, wherein the replay parameters comprise a time period that corresponds to at least some of the displayed measurement values.

10. The portable handheld measurement device of claim 1, wherein the computer-executable instructions are further configured to cause the portable handheld measurement device to store contextual data associated with the measurement values.

11. The portable handheld measurement device of claim 10, wherein the contextual data comprises one or more of timestamp information, location information, project information, job site information, and environmental conditions.

12. The portable handheld measurement device of claim 1, wherein the portable handheld measurement device comprises a digital multimeter.

13. A portable handheld measurement device, comprising:
a user input component;
an output component;
measurement circuitry configured to measure one or more electrical or mechanical parameters and generate corresponding measurement values, wherein the measurement values are associated with contextual data;
a processor; and
a storage system having stored therein computer-executable instructions configured to cause the portable handheld measurement device to concurrently automatically store:
the measurement values and the associated contextual data in the storage system according to a persistent storage mode; and
the same measurement values in the storage system according to a limited replay storage mode,
wherein the limited replay storage mode comprises a storage limitation that is not present in the persistent storage mode, and
wherein information stored in the limited replay storage mode is stored in volatile memory while information stored in the persistent storage mode is stored in nonvolatile storage.

14. The portable handheld measurement device of claim 13, wherein the computer-executable instructions are further configured to automatically store user input events associated with the user input device according to the persistent storage mode.

15. The portable handheld measurement device of claim 13, wherein the computer-executable instructions are further configured to automatically store the associated contextual data according to the limited replay storage mode.

16. The portable handheld measurement device of claim 13, further comprising a communication system configured to transmit the measurement values and the associated contextual data to a post-processing computing device.

17. The portable handheld measurement device of claim 13, wherein the computer-executable instructions are further configured to adapt storage of information in the persistent storage mode and/or the limited replay storage mode based on user-configurable settings.

18. A portable handheld measurement device, comprising:
an input/output interface comprising a display;
measurement circuitry configured to measure one or more electrical or mechanical parameters and generate corresponding measurement values, wherein the measurement values are associated with contextual data;
a processor; and
a storage system comprising volatile memory and nonvolatile memory, the storage system having stored therein computer-executable instructions configured to cause the portable handheld measurement device to:
automatically and concurrently store both (1) the measurement values and the associated contextual data in the nonvolatile memory according to a persistent storage mode and (2) the same measurement values in the volatile memory according to a limited replay storage mode, wherein the limited replay mode comprises a storage limitation that is not present in the persistent storage mode, and wherein, to accommodate the storage limitation and to provide access to more recent measurement values in the volatile memory, the limited replay storage mode permits overwriting measurement values previously stored in the volatile memory, the plurality of measurement values being stored in the volatile memory using a rolling time window in which least recent measurement values in the volatile memory are automatically overwritten by most recent measurement values;

display a user interface comprising at least some of the measurement values stored according to the limited replay storage mode;

receive user input via the input/output interface; and display a modified version of the user interface based at least in part on the user input.

19. The portable handheld measurement device of claim 13, wherein, in the persistent storage mode, the measurement values and associated contextual data are stored in the nonvolatile storage for the operative life of the portable handheld measurement device.

20. The portable handheld measurement device of claim 13, wherein, in the limited replay storage mode, the measurement values are automatically stored in the volatile memory using a rolling time window in which least recent measurement values in the volatile memory are automatically overwritten by most recent measurement values.

* * * * *